(12) United States Patent
Kim

(10) Patent No.: US 6,664,614 B2
(45) Date of Patent: Dec. 16, 2003

(54) LEAD FRAME AND BOTTOM LEAD SEMICONDUCTOR PACKAGE USING THE LEAD FRAME

(75) Inventor: Sun Dong Kim, Cheongju (KR)

(73) Assignee: Hyundai MicroElectronics Co., Ltd., Choongcheongbuk-Do (KR)

(*) Notice: Subject to any disclaimer, the term of this patent is extended or adjusted under 35 U.S.C. 154(b) by 0 days.

(21) Appl. No.: 09/415,268

(22) Filed: Oct. 12, 1999

(65) Prior Publication Data

US 2002/0167074 A1 Nov. 14, 2002

(30) Foreign Application Priority Data

Apr. 17, 1999 (KR) ......................................... 1999-13694

(51) Int. Cl.[7] ............................................. H01L 23/495
(52) U.S. Cl. ....................... 257/666; 257/669; 257/670; 257/672; 257/676
(58) Field of Search .............................. 257/666, 669, 257/670, 672, 676

(56) References Cited

U.S. PATENT DOCUMENTS

| | | | |
|---|---|---|---|
| 5,172,214 A | * | 12/1992 | Casto |
| 5,343,072 A | | 8/1994 | Imai et al. .................. 257/666 |
| 5,389,739 A | * | 2/1995 | Mills |
| 5,686,698 A | | 11/1997 | Mahadevan et al. ....... 174/52.4 |
| 5,736,432 A | * | 4/1998 | Mackessy |
| 5,770,888 A | * | 6/1998 | Song et al. |
| 6,043,430 A | * | 3/2000 | Chun |
| 6,252,299 B1 | * | 6/2001 | Masuda et al. |
| 6,262,482 B1 | * | 7/2001 | Shiraishi et al. |

FOREIGN PATENT DOCUMENTS

JP          2302051        * 12/1990

* cited by examiner

Primary Examiner—David E. Graybill
(74) Attorney, Agent, or Firm—Morgan, Lewis & Bockius LLP

(57) ABSTRACT

A lead frame includes a pair of guide rails separated at a predetermined space; at least one dam bar for connecting the pair of guide rails; a die paddle for mounting a semiconductor chip between the dam bar; a tie bar for supporting the die paddle; a plurality of leads each consisting of a first lead having a predetermined length extended from the dam bar between the dam bar and the die paddle, a second lead connected electrically to the first lead and formed bent in a first direction, and a third lead connected electrically to the second lead and formed bent in a second direction.

5 Claims, 14 Drawing Sheets

LEAD FRAME AND BOTTOM LEAD SEMICONDUCTOR PACKAGE USING THE LEAD FRAME

BACKGROUND OF THE INVENTION

1. Field of the Invention

The present invention relates to a semiconductor chip package, and in particular to a lead frame and bottom lead semiconductor package using the lead frame of which leads serving as an external connection terminal are respectively exposed on both first surface and second surface of the package.

2. Description of the Background Art

FIG. 1A is a perspective view of a two-chip stacked semiconductor device in accordance with a background art, and FIG. 1B is a cross-sectional view of the stacked semiconductor device taken along line b—b of FIG. 1A in accordance with the background art.

The stacked semiconductor package 5 according to the background art is constructed in that, on a first surface of a lower semiconductor package 2 having a plurality of outer leads 2a, an upper semiconductor package 1 having a plurality of outer leads 2a corresponding one by one to the plurality of outer leads 1a is stacked, and the mutually corresponding outer leads 1a and 2a between the packages 1 and 2 are electrically connected by rails 3.

The lower semiconductor package 2 and the upper semiconductor package 1 have the same size, and respective outer leads 1a and 2a also have the same size. The outer leads 1a and 2a are formed short. The rail 3 has a hole through which the mutually corresponding outer leads 1a and 2a of the semiconductor packages 1 and 2 are protruded. The rails are used for electrically connecting the outer leads 1a and 2a of each vertical line of the stacked semiconductor package 5 to each other, of which a lower portion is bent in a J-shape, a I-shape or a gull-shape.

FIGS. 2A through 2C are sectional views for showing fabricating process of the stacked semiconductor package illustrated in FIGS. 1A and 1B in accordance with the background art.

As shown in these drawings, there is provided an upper semiconductor packages each having a plurality of outer leads 1a exposed at its side. Each package has the same size to each other, and each outer lead 1a has the same size. The outer leads 1a are formed short. And, there is also provided a lower semiconductor package 2 having the same shape as the upper semiconductor package 1.

Referring to FIG. 2B, the upper semiconductor package 1 is stacked on the lower semiconductor package 2 by using an adhesive member 100. Each outer lead 1a of the upper semiconductor package 1 is corresponding one by one to each outer lead 2a of the lower semiconductor package 2, of which size and shape are the same to each other.

Referring to FIG. 2C, rails 3 having the hole at the position corresponding to each lead 1a and 2a are inserted to the outer leads 1a and 2a to electrically connect the mutually corresponding outer leads 1a and 2a of the packages 1 and 2 and then is soldered to thereby complete the stacked semiconductor package 5 in the background art. The rails 3 are mutually and electrically insulated to each other, being used for electrically connecting the outer leads 1a and 2a of each vertical line of the stacked semiconductor package 5 to each other, of which a lower portion is bent in a J-shape, a I-shape or a gull-shape.

However, the background semiconductor package as described above has disadvantages in that, firstly, the additional process is needed to make the rails to electrically connect the mutually corresponding outer leads, secondly, since the rails must be inserted to the outer leads one by one, its process is inefficient, and thirdly, the rails are required to be attached to the package by separate production, making an overall align process impossible.

SUMMARY OF THE INVENTION

Therefore, an object of the present invention is to provide a lead frame and bottom lead semiconductor package using the lead frame of which leads serving as an external connection terminal are respectively exposed on both a first surface and a second surface of the package to thereby facilitate stacking and improving a heat release.

In order to achieve the above object of the present invention, there is provided a lead frame in accordance with one embodiment of the present invention including: a pair of guide rails separated at a predetermined space; at least one dam bar for connecting the pair of guide rails; a die paddle for mounting a semiconductor chip between the dam bar; a tie bar for supporting the die paddle; and a plurality of leads each consisting of a first lead having a predetermined length extended from the dam bar between the dam bar and the die paddle, a second lead connected electrically to the first lead and formed bent in a first direction, and a third lead connected electrically to the second lead and formed bent in a second direction.

The second and third leads are bent in a predetermined depth from the first lead in the opposite direction to each other.

There is also provided a lead frame in accordance with another embodiment of the present invention including a pair of guide rails separated parallel with each other at a predetermined space; at least one dam bar for connecting the pair of guide rails; a first lead having a predetermined length extended from one end portion of the dam bar; and a second and a third leads extended from a predetermined portion of the first lead to the dam bar.

The second and third lead are respectively formed at both sides of the first lead, and are respectively bent in the opposite direction to each other in a predetermined depth.

In addition, there is provided a bottom lead semiconductor package in accordance with one embodiment of the present invention including a lead frame including a plurality of leads each consisting of a first lead having a predetermined length, a second and a third leads extended from the first lead, and a die paddle; a semiconductor chip having a plurality of bonding pads attached onto the die paddle of the lead frame; a connection means for electrically connecting the plurality of first leads to the plurality of bonding pads; and a package main body of which a predetermined region including the semiconductor chip, the wire, and the lead frame is molded by using a molding resin with at least one surface of each of the die paddle, second and third leads exposed.

There is also provided a bottom lead semiconductor package in accordance with another embodiment of the present invention including: a semiconductor chip having a first and a second surfaces, and having a plurality of bonding pads on the first surface; a plurality of leads each consisting of a first lead having a first and a second surfaces, the first surface being attached onto the first surface of the semiconductor chip, a second and a third leads each having a first and a second surfaces extended from a predetermined portion of the first lead; a connection means for electrically connecting the first leads and the bonding pads; and a package main body of which a predetermined region including the semiconductor chip, the lead and the connection means are sealed with the first surface of the second leads and the second surface of the third leads exposed respectively.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1A:
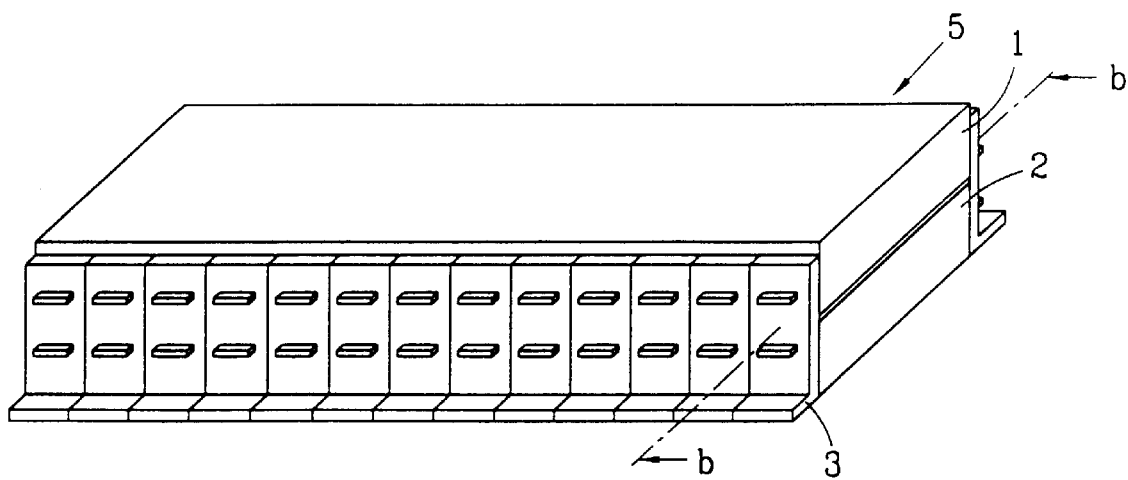
FIG. 1A is a perspective view of a stacked semiconductor device in accordance with a background art.
Figure 1B:
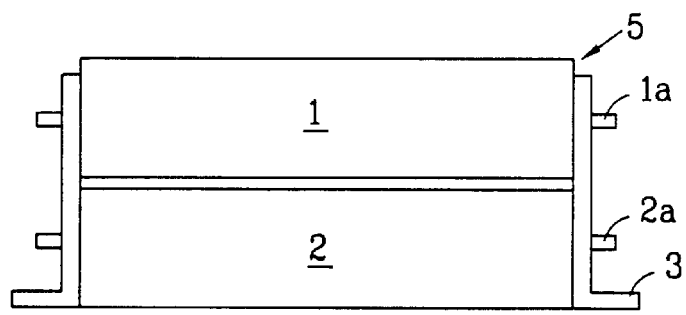
FIG. 1B is a cross-sectional view of the stacked semiconductor device taken along line b—b of FIG. 1A in accordance with the background art.
Figure 2A:
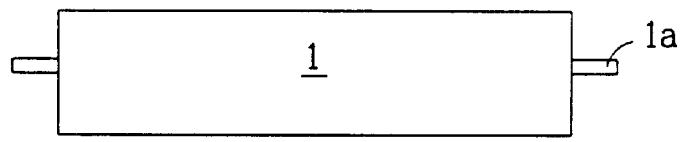
FIGS. 2A through 2C are sectional views for showing fabricating process of the stacked semiconductor package illustrated in FIGS. 1A and 1B in accordance with the background art.
Figure 2B:
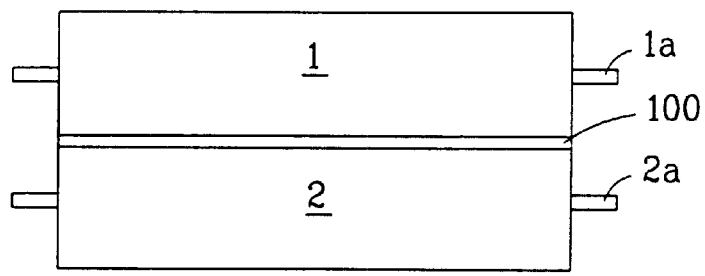
Figure 2C:
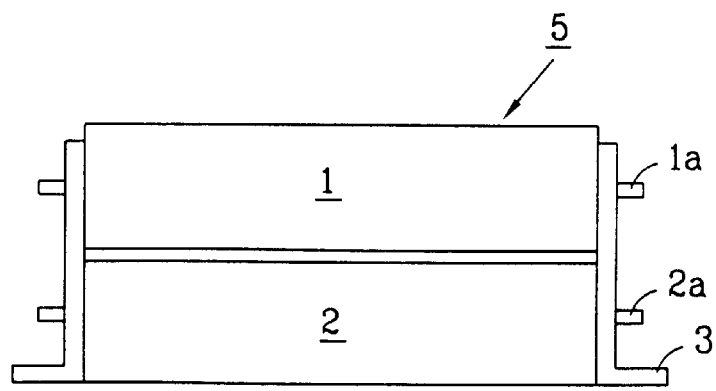
Figure 3A:
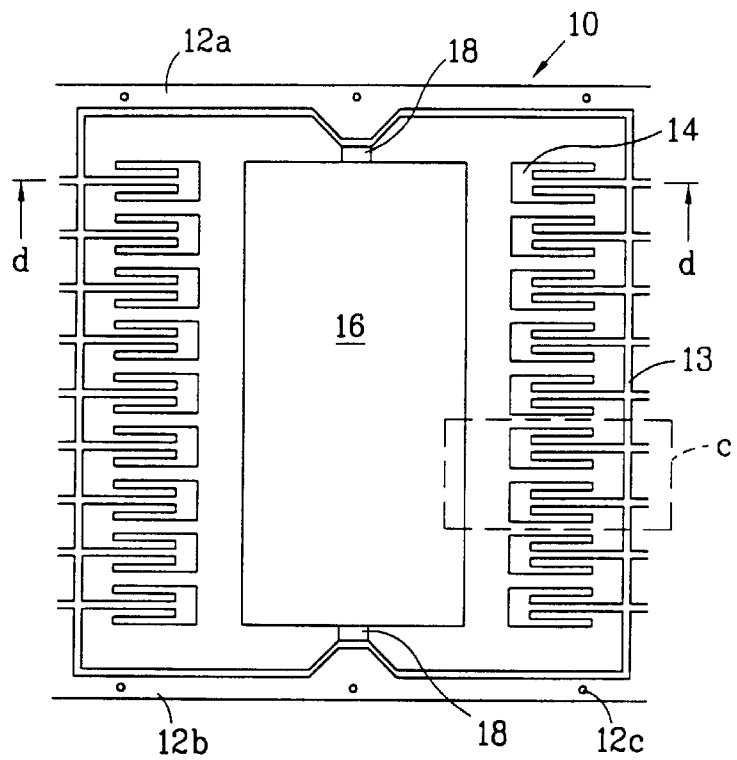
FIG. 3A is a plan view of a lead frame in accordance with one embodiment of the present invention.
Figure 3B:
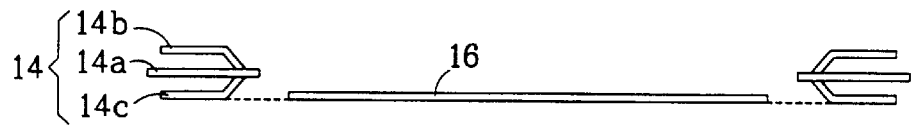
FIG. 3B is a cross-sectional view of the lead frame taken along line d—d of FIG. 3A in accordance with one embodiment of the present invention.
Figure 3C:
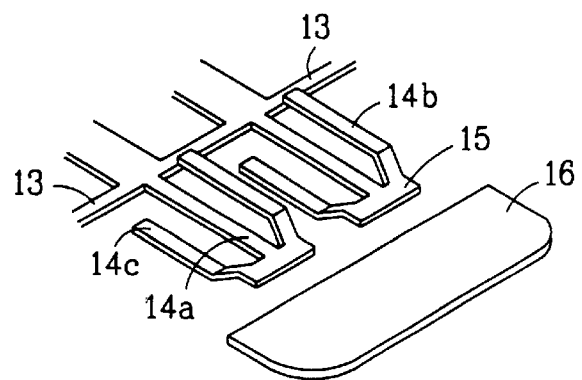
FIG. 3C is an enlarged perspective view of the portion 'C' of FIG. 3A in accordance with the present invention.

FIG. 3A is a plan view of a lead frame in accordance with one embodiment of the present invention, FIG. 3B is a cross-sectional view of the lead frame taken along line d—d of FIG. 3A in accordance with one embodiment of the present invention, and FIG. 3C is an enlarged perspective view of the portion 'C' of FIG. 3A in accordance with the present invention.

As shown in these drawings, the lead frame 10 has a pair of guide rails 12a and 12b with a predetermined space therebetween, which serves as a transferring guide during fabricating of a semiconductor package, and an index hole 12c for position alignment on its first surface. A plurality of dam bars 13 connected vertically between the guide rails 12a and 12b are formed at predetermined intervals. The dam bars 13 prevent a molding resin from permeating through other parts during fabricating of the semiconductor package.

A plurality of leads 14 include a first lead 14a extended parallel to the guide rails 12 and 12b from both end portions of the dam bar 13, a wire contact portion 15 formed at one end of the first lead, a second lead 14b formed bent in a first direction from the wire contact portion 15, and a third lead 14c formed bent in a second direction from the wire contact portion 15.

The second and third leads 14b and 14c are formed to be parallel to the guide rails 12a and 12b at both sides of the first lead 14a. The plurality of leads 14 are supported by the dam bar 13.

A die paddle 16, on which a semiconductor chip is mounted is formed between the dam bars 13, is supported by a tie bar 18. The tie bar 18 is bent downwardly in a predetermined depth.

Figure 4A:
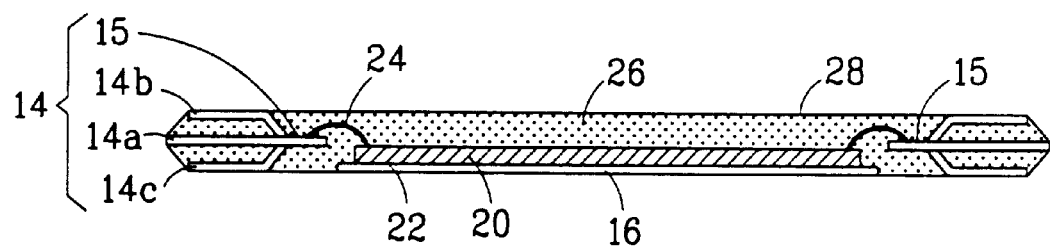
FIG. 4A is a cross-sectional view of a bottom lead semiconductor package using the lead frame illustrated in FIGS. 3A through 3C in accordance with the present invention.
Figure 4B:
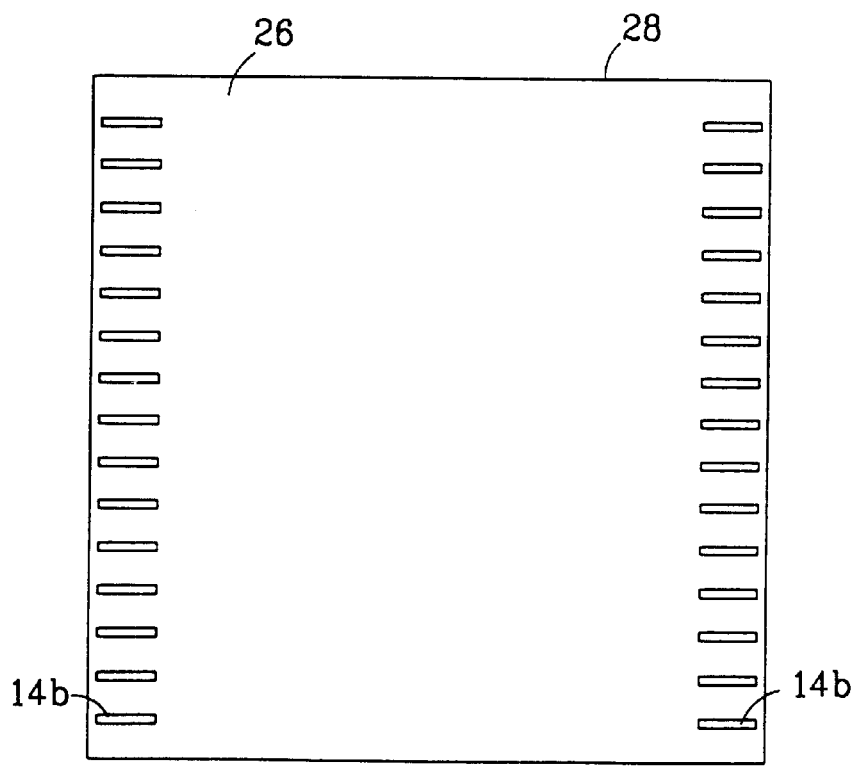
FIG. 4B is a plan view of the bottom lead semiconductor package using the lead frame illustrated in FIGS. 3A through 3C in accordance with the present invention.
Figure 4C:
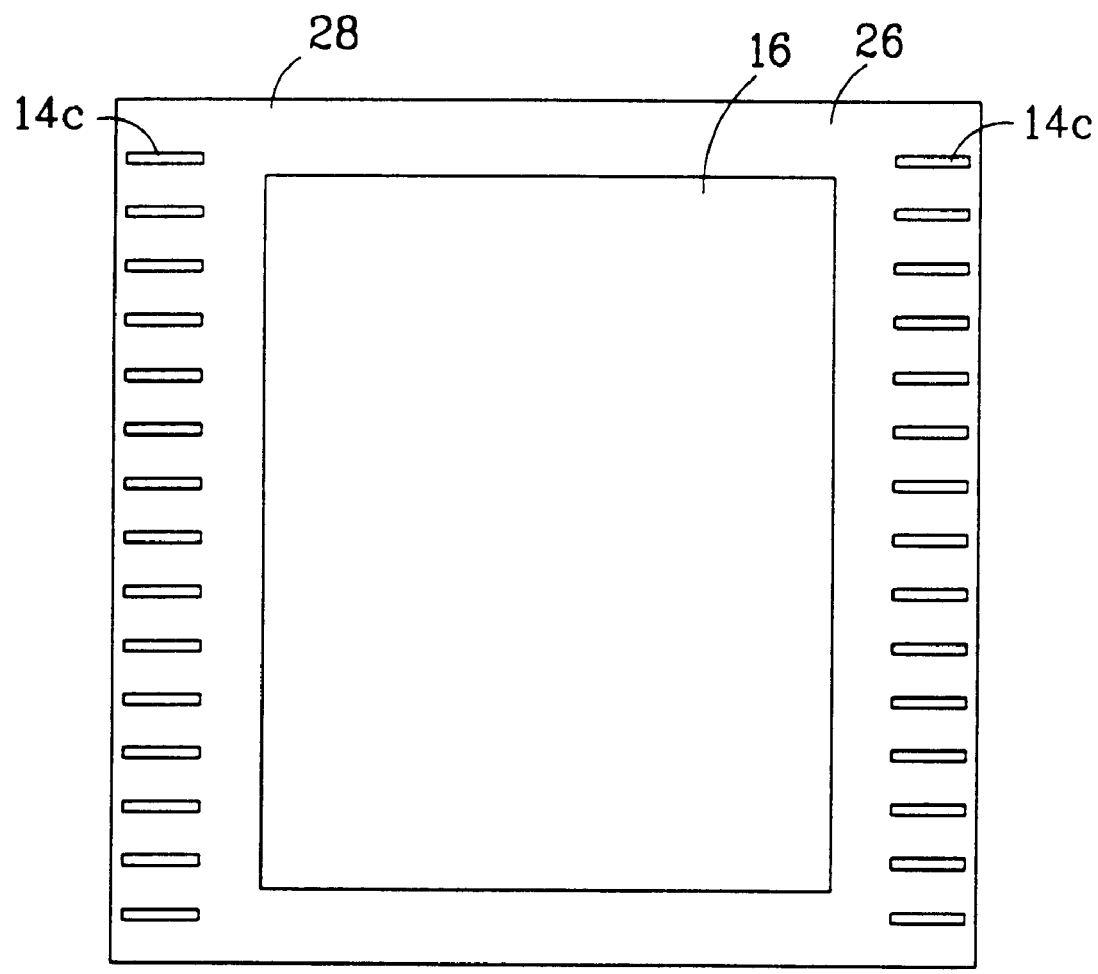
FIG. 4C is a rear view of the bottom lead semiconductor package using the lead frame illustrated in FIGS. 3A through 3C in accordance with the present invention.

FIG. 4A is a cross-sectional view of a bottom lead semiconductor package using the lead frame illustrated in FIGS. 3A through 3C in accordance with the present invention, FIG. 4B is a plan view of the bottom lead semiconductor package using the lead frame illustrated in FIGS. 3A through 3C in accordance with the present invention, and FIG. 4C is a rear view of the bottom lead semiconductor package using the lead frame illustrated in FIGS. 3A through 3C in accordance with the present invention.

As shown in these drawings, a bottom lead semiconductor package in accordance with the present invention includes a plurality of leads 14 consisting of a first lead 14a, a second lead 14b, a third lead 14c and a wire contact portion 15, and a die paddle 16. The second lead 14b is formed bent in the first direction from the wire contact portion 15, of which a predetermined portion is exposed on the upper portion of the package. The third lead 14c is formed bent in the second direction from the wire contact portion 15, of which a predetermined portion is exposed on the lower portion of the package.

A semiconductor chip 20 having a plurality of bonding pads (not shown) is attached on the die paddle 16 of the lead frame 10 by using a bifacial tap, that is, an insulating adhesive member 22.

Normally, the bonding pads of the semiconductor chip 20 are positioned near an edge of the chip 20. The plurality of first leads 14a and the plurality of bonding pads are electrically connected, respectively, by using the plurality of conductive wires 24. The second surface of the die paddle 16, the first surface of a predetermined portion of the second lead 14b, and the second surface of a predetermined portion of the third lead 14c are molded to be exposed. The second and the third leads 14b and 14c exposed in the first and second surfaces of the package main body 28 are positioned at both sides of the first lead 14c.

Figure 5A:
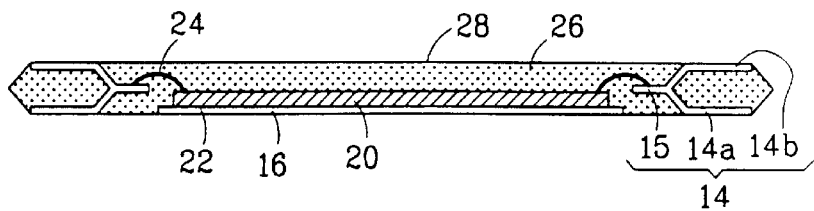
FIG. 5A is a cross-sectional view of a bottom lead semiconductor package in accordance with a first modification of FIGS. 4A through 4C of the present invention.
Figure 5B:
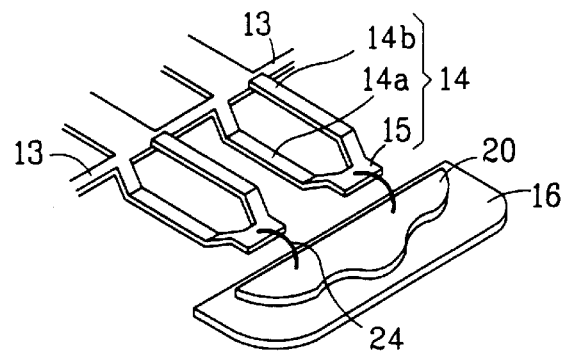
FIG. 5B is a partial enlarged perspective view of the bottom lead semiconductor package in accordance with the first modification of FIGS. 4A through 4C of the present invention.

FIG. 5A is a cross-sectional view of a bottom lead semiconductor package in accordance with a first modification of FIGS. 4A through 4C of the present invention, and FIG. 5B is a partial enlarged perspective view of the bottom lead semiconductor package in accordance with the first modification of FIGS. 4A through 4C of the present invention.

Referring to FIG. 5A, the bottom lead semiconductor package in accordance with a first modification of the present invention has the same structure as that of above-described one embodiment except that the lead 14 has a different shape thereto.

Referring to FIG. 5B, the lead 14 accordance with the first modification of the present invention includes a first lead 14a extended from the dam bar 13, a wire contact portion 15 formed at one end portion of the first lead 14a, and a second lead 14b formed bent in the first direction from the wire contact portion 15. The first lead 14a is formed bent in the second direction from the wire contact portion 15 and the dam bar 13.

A predetermined portion of the first lead 14a is exposed on the second surface of the package main body 28 after molding, and a predetermined portion of the second lead 14b is exposed on the first surface of the package main body 28 after molding, so that each predetermined portion of the first lead 14a and the second lead 14b serves as an external connection terminal for electrical connection to the outside.

Figure 6A:
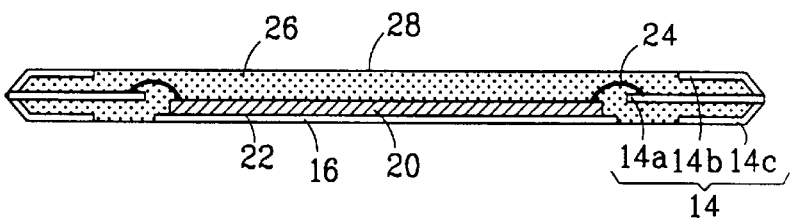
FIG. 6A is a cross-sectional view of a bottom lead semiconductor package in accordance with a second modification of FIGS. 4A through 4C of the present invention.
Figure 6B:
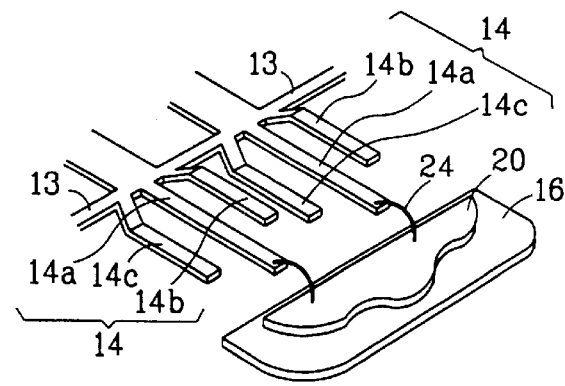
FIG. 6B is a partial enlarged perspective view of the bottom lead semiconductor package in accordance with the second modification of FIGS. 4A through 4C of the present invention.

FIG. 6A is a cross-sectional view of a bottom lead semiconductor package in accordance with a second modification of FIGS. 4A through 4C of the present invention, and FIG. 6B is a partial enlarged perspective view of the bottom lead semiconductor package in accordance with the second modification of FIGS. 4A through 4C of the present invention.

Referring to FIG. 6A, the bottom lead semiconductor package in accordance with a second modification of the present invention has the same structure as that of above-described one embodiment except that the lead 14 has a different shape thereto.

Referring to FIG. 6B, the lead 14 in accordance with the second modification includes a first lead 14a having a predetermined length extended from the dam bar 13, a second lead formed bent in the first direction from the dam bar 13, a third lead 14c formed bent in the second direction from the dam bar 13.

A predetermined portion of the second lead is exposed on the first surface of the package main body 28 after molding, and a predetermined portion of the third lead 14c is exposed on the second surface of the package main body 28, so that each predetermined portion of the second lead 14b and the third lead 14c serves as an external connection terminal for electrical connection to the outside.

Each of the one ends of the first, second and third leads 14a, 14b and 14c is connected to the dam bar, while each of the other ends of them are separated.

Figure 7A:
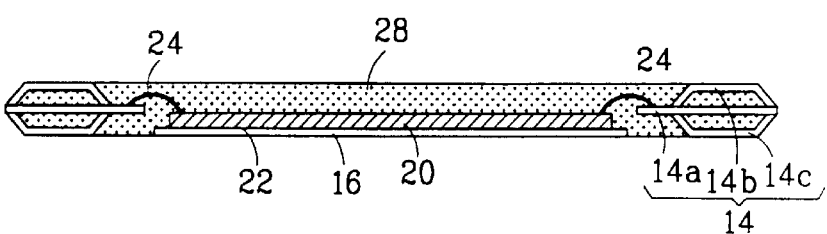
FIG. 7A is a cross-sectional view of a bottom lead semiconductor package in accordance with a third modification of FIGS. 4A through 4C of the present invention.
Figure 7B:
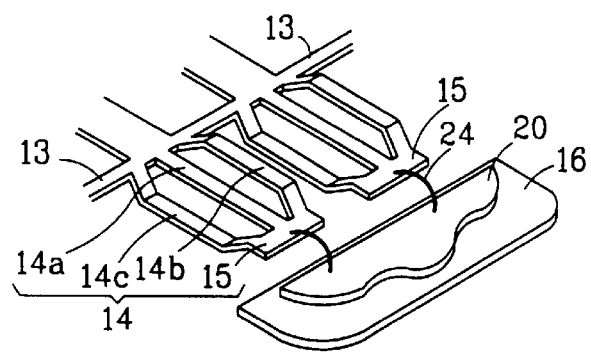
FIG. 7B is a partial enlarged perspective view of the bottom lead semiconductor package in accordance with the third modification of FIGS. 4A through 4C of the present invention.

FIG. 7A is a cross-sectional view of a bottom lead semiconductor package in accordance with a third modification of FIGS. 4A through 4C of the present invention, and FIG. 7B is a partial enlarged perspective view of the bottom lead semiconductor package in accordance with the third modification of FIGS. 4A through 4C of the present invention.

Referring to FIG. 7A, the bottom lead semiconductor package in accordance with a third modification of the present invention has the same structure as that of above-described one embodiment except that the lead 14 has a different shape thereto.

The lead 14 in accordance with the third modification of the present invention includes a first lead 14a having a predetermined length extended from a dam bar 13, a second lead 14b formed bent in the first direction from the dam bar 13 and a wire contact portion 15, a third lead 14c formed bent in the second direction from the dam bar 13 and the wire contact portion 15, and the wire contact portion 15. One ends of each of the first, second and third leads 14a, 14b and 14c are connected to the dam bar 13, while the other ends thereof are connected to the wire contact portion 15.

A predetermined portion of the second lead is exposed on a first surface of the package main body 28, and a predetermined portion of the third lead is exposed on a second surface of the package main body 28, so that each predetermined portion of the second lead 14b and the third lead 14c serves as an external connection terminal for electrical connection to the outside.

FIGS. 8A through 8d are sectional view showing fabricating process of the bottom lead semiconductor package illustrated in FIGS. 4A through 4C of the present invention.

Figure 8A:
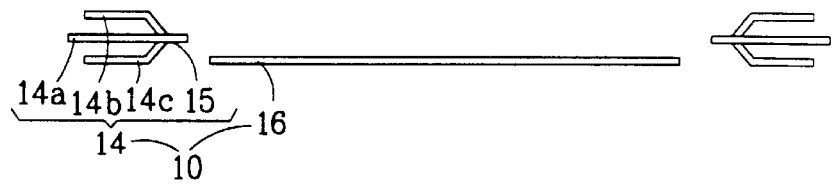
FIGS. 8A through 8D are sectional view showing fabricating process of the bottom lead semiconductor package illustrated in FIGS. 4A through 4C of the present invention.

Referring to FIG. 8A, a lead frame 10 includes a first lead provided a wire contact portion 15 at one end thereof, a second lead 14b formed bent in the first direction from the wire contact portion 15, a third lead 14c formed bent in the second direction from the wire contact portion 15, the wire contact portion 15 and a die paddle 16.

Figure 8B:
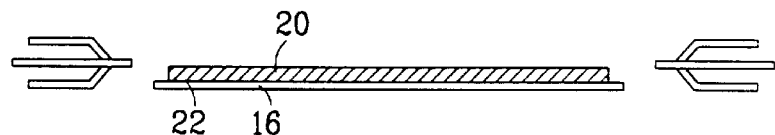

Referring to FIG. 8B, a semiconductor chip 20 having a plurality of bonding pads (not shown) is attached onto the die paddle 16 by using a bilateral tape, that is, an insulating adhesive 22.

Figure 8C:
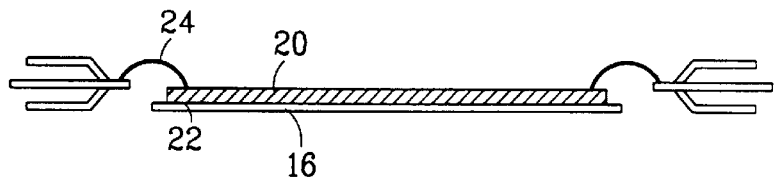

Referring to FIG. 8C, the wire contact portions 15 and the bonding pads are electrically connected by using a conductive wire 24.

Figure 8D:
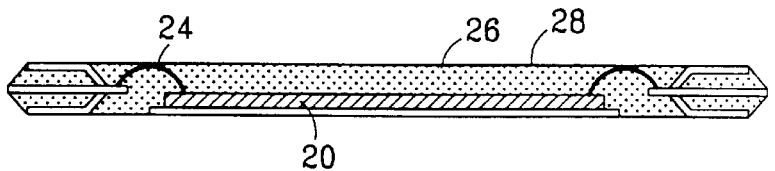

Referring to FIG. 8D, a predetermined region including the semiconductor chip 20, the wire 24 and the lead 14 are sealed by using a molding resin 26 to form a package main body 28 in a manner that a predetermined portion of the second lead 14b is exposed on its first surface and a predetermined portion of the third lead 14c is exposed on its second surface.

Referring to FIG. 3A, after the molding process, the tie bar 18 of the lead frame 10 is cut and the guide rails 12a and 12b and the dam bar 13 supporting the leads 14 are also cut, to electrically separate the leads 14.

Figure 9A:
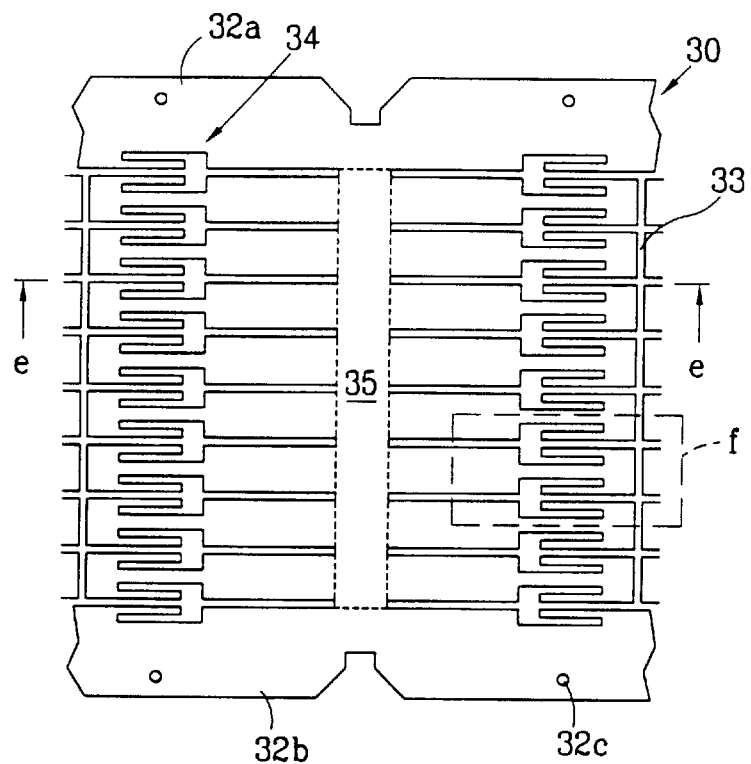
FIG. 9A plan view of a lead frame in accordance with another embodiment of the present invention.
Figure 9B:
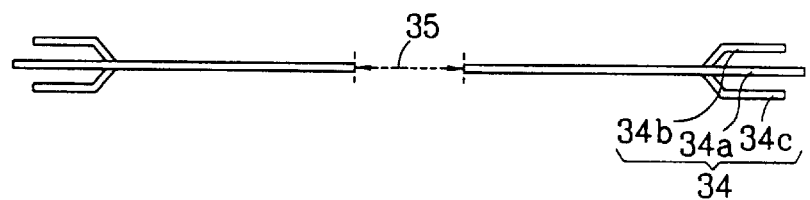
FIG. 9B is a cross-sectional view of the lead frame taken along line e—e of FIG. 9A in accordance with another embodiment of the present invention.
Figure 9C:
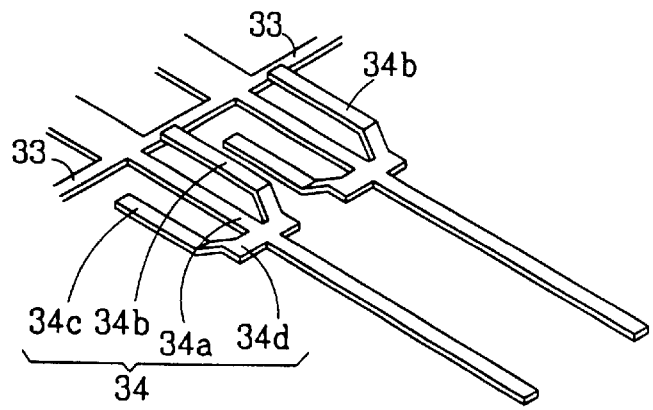
FIG. 9C is an enlarged perspective view of the portion 'F' of FIG. 9A in accordance with another embodiment of the present invention.

FIG. 9A is a plan view of a lead frame in accordance with another embodiment of the present invention, FIG. 9B is a cross-sectional view of the lead frame taken along line e—e of FIG. 9A in accordance with another embodiment of the present invention, and FIG. 9C is an enlarged perspective view of the portion 'F' of FIG. 9A in accordance with another embodiment of the present invention.

Referring to FIGS. 9A and 9B, a lead frame 30 in accordance with a second embodiment has a pair of guide rails 32a and 32b separated in parallel at a predetermined interval. The guide rails 32a and 32b, having an index hole 32c for position alignment thereon, serves as a transferring guide during fabricating of the semiconductor package.

A plurality of dam bars 33 are separately formed to each other, being vertically connected between the guide rails 32a and 32b. The dam bar 33 prevents a molding resin from permeating to other place during fabricating of the semiconductor. An opening 35 having a predetermined width is formed between the dam bars 33, through which the bonding pads formed at the central portion of the semiconductor chip is exposed.

Referring to FIG. 9C, the plurality of leads 34 includes a first lead 34a extended in parallel from both ends of the dam bar 33 to the guide rails 32a and 32b, a lead distribution portion 34d having a predetermined length formed to be vertical to the first lead and parallel to the dam bar 33, a second lead 34b formed bent in the first direction from the lead distribution portion 34d, a third lead 34c formed bent in the second direction from the lead distribution portion 34d, and the lead distribution portion. The second lead 34b and the third lead 34c are positioned at both sides of the first lead 34a, being formed parallel to the first lead 34a and vertical to the lead distribution portion 34d.

Figure 10A:
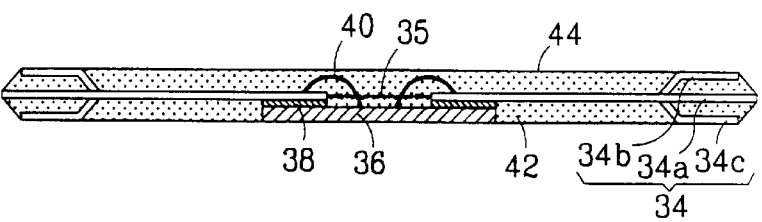
FIG. 10A is a cross-sectional view of a bottom lead semiconductor package using the lead frame illustrated in FIGS. 9A through 9C of the present invention.
Figure 10B:
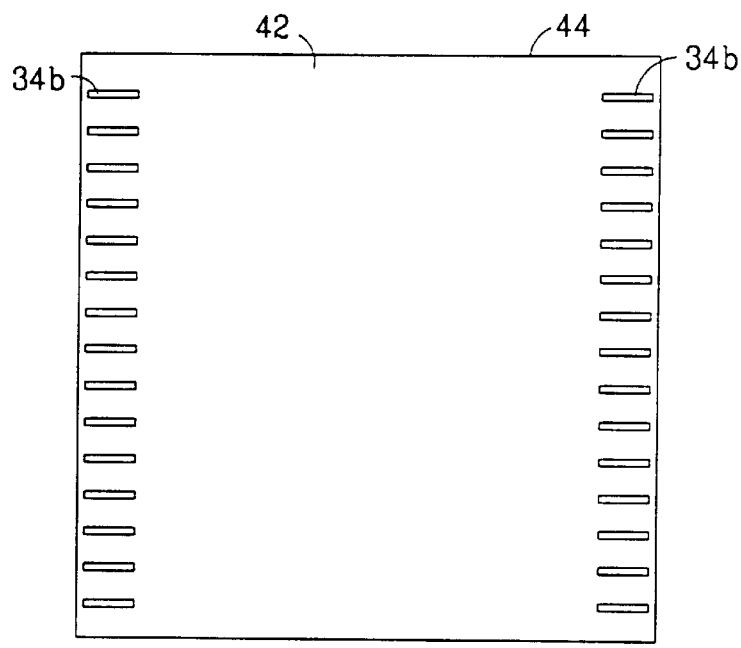
FIG. 10B is a plan view of the bottom lead semiconductor package using the lead frame illustrated in FIGS. 9A through 9C of the present invention.
Figure 10C:
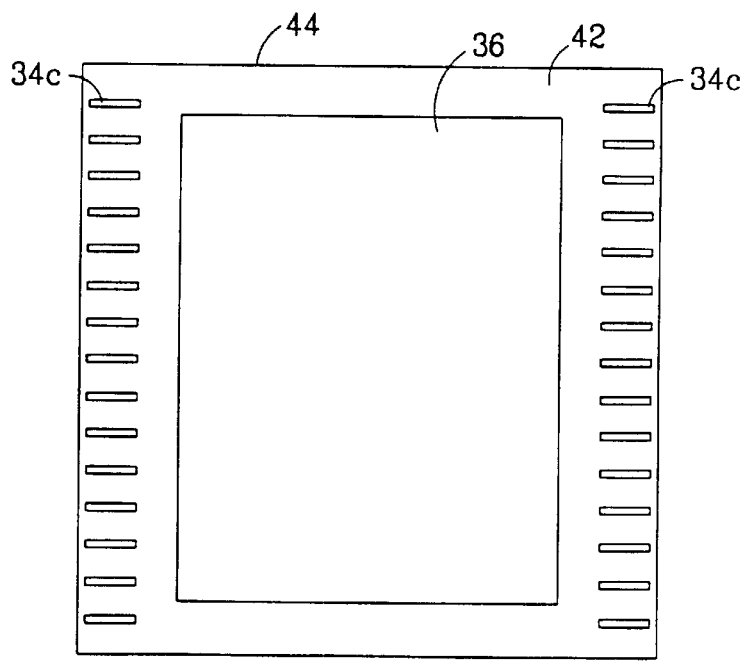
FIG. 10C is a rear view of the bottom lead semiconductor package using the lead frame illustrated in FIGS. 9A through 9C of the present invention.

FIG. 10A is a cross-sectional view of a bottom lead semiconductor package using the lead frame illustrated in FIGS. 9A through 9C of the present invention, FIG. 10B is a plan view of the bottom lead semiconductor package using the lead frame illustrated in FIGS. 9A through 9C of the present invention, and FIG. 10C is a rear view of the bottom lead semiconductor package using the lead frame illustrated in FIGS. 9A through 9C of the present invention.

Referring to FIGS. 10A through 10C, the bottom lead semiconductor package in accordance with the present invention includes a first lead 34a to which wire 34 is bonded, a second lead 34b of which a predetermined portion is exposed on the first surface of the package main body 44 after molding, a third lead of which a predetermined portion is exposed on the second surface of the package main body 44 after molding, so that each predetermined portion of the second lead 34b and the third lead 34c serves as an external connection terminal for electrical connection to the outside.

A semiconductor chip 35 having a plurality of bonding pads (not shown) is attached onto a predetermined portion of the second surface of the first lead 34a by using an insulating adhesive member 38. The bonding pads of the semiconductor chip 36 and the first leads 34a are electrically connected by using a plurality of conductive wires 40. A predetermined region including the lead 34, the semiconductor chip 36 and the wire 40 is sealed by a molding resin 42 to form the package main body 44 with a predetermined portions of the second and third leads 34b and 34c exposed outward. Normally, the bonding pads of the semiconductor chip 36 are positioned at the center of the chip 36.

Figure 11A:
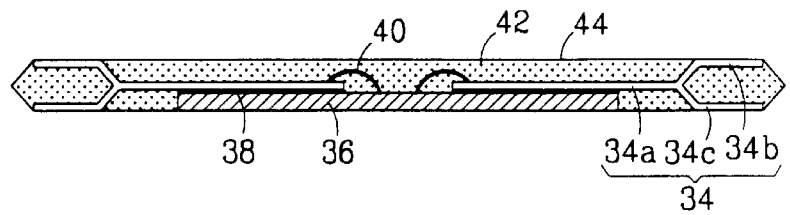
FIG. 11A is a cross-sectional view of a bottom lead semiconductor package in accordance with a first modification of FIGS. 10A through 10C of the present invention.
Figure 11B:
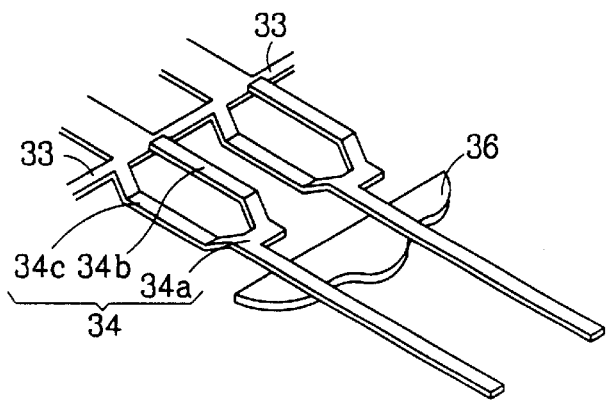
FIG. 11B is a partial enlarged perspective view of the bottom lead semiconductor package in accordance with the first modification of FIGS. 10A through 10C of the present invention.

FIG. 11A is a cross-sectional view of a bottom lead semiconductor package in accordance with a first modification of FIGS. 10A through 10C of the present invention, and FIG. 11B is a partial enlarged perspective view of the bottom lead semiconductor package in accordance with the first modification of FIGS. 10A through 10C of the present invention.

Referring to FIG. 11A, the bottom lead semiconductor package in accordance with a first modification of the present invention has the same structure as that of above-described one embodiment except that the lead 34 has a different shape thereto.

Referring to FIG. 11B, the lead 34 in accordance with the first modification includes an 'L'-shaped first lead 34a to which the wire 40 is bonded, a second lead 34b formed bent in the first direction from a predetermined portion of the first lead 34a, and a third lead 34c formed bent in the second direction from the dam bar 33 and the first lead 34a. The second lead 34b and the third lead 34c are formed parallel to each other, both being vertical to the dam bar 33. One ends of both the second lead 34b and the third lead 34c are electrically connected through the first lead 34a.

A predetermined portion of the second lead 34b is exposed on the first surface of the package main body 44, while a predetermined portion of the third lead 34c is exposed on the second surface of the package main body 44, so that each predetermined portion of the second lead 34b and the third lead 34c serves as an external connection terminal for electrical connection to the outside.

Figure 12A:
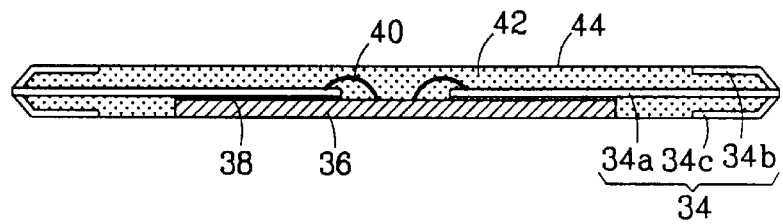
FIG. 12A is a cross-sectional view of a bottom lead semiconductor package in accordance with a second modification of FIGS. 10A through 10C of the present invention.
Figure 12B:
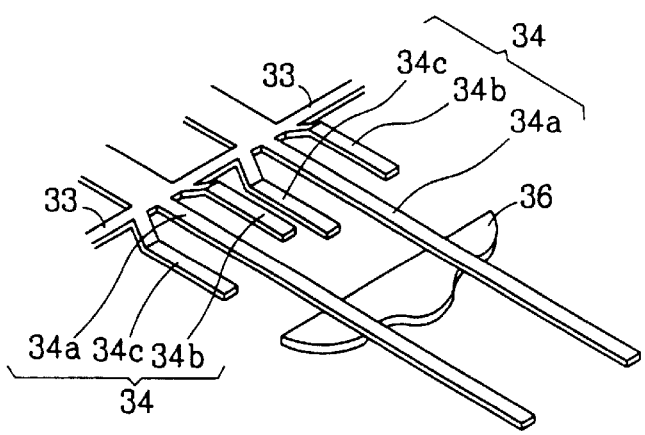
FIG. 12B is a partial enlarged perspective view of the bottom lead semiconductor package in accordance with the second modification of FIGS. 10A through 10C of the present invention.

FIG. 12A is a cross-sectional view of a bottom lead semiconductor package in accordance with a second modification of FIGS. 10A through 10C of the present invention, and FIG. 12B is a partial enlarged perspective view of the bottom lead semiconductor package in accordance with the second modification of FIGS. 10A through 10C of the present invention.

Referring to FIG. 12A, the bottom lead semiconductor package in accordance with a second modification of the present invention has the same structure as that of above-described one embodiment except that the lead 34 has a different shape thereto.

Referring to FIG. 12B, the lead 34 in accordance with the second modification includes a first lead 34a having a predetermined length vertically extended from the dam bar 33, a second lead 34b formed bent in the first direction from the dam bar 33, a third lead 34c formed bent in the second direction from the dam bar 33. The second lead 34b and the third lead 34c are respectively positioned at both sides of the first lead 34a to be parallel to each other, while being vertical to the dam bar 33. After molding, each predetermined portion of the second lead 34b and the third lead 34c is exposed at the first and second surfaces of the package main body for an electrical connection with an outside.

One ends of each of the first, second and third leads 34a, 34b and 34c are connected to the dam bar 33, while the other ends thereof are separated without connection.

Figure 13A:
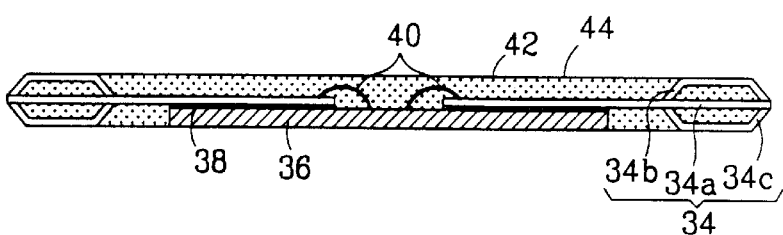
FIG. 13A is a cross-sectional view of a bottom lead semiconductor package in accordance with a third modification of FIGS. 10A through 10C of the present invention.
Figure 13B:
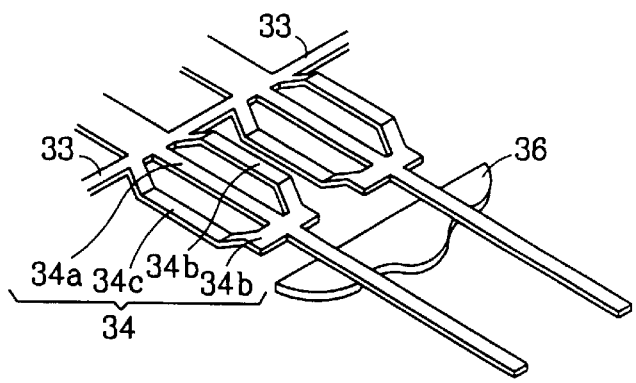
FIG. 13B is a partial enlarged perspective view of the bottom lead semiconductor package in accordance with the third modification of FIGS. 10A through 10C of the present invention.

FIG. 13A is a cross-sectional view of a bottom lead semiconductor package in accordance with a third modification of FIGS. 10A through 10C of the present invention, and FIG. 13B is a partial enlarged perspective view of the bottom lead semiconductor package in accordance with the third modification of FIGS. 10A through 10C of the present invention.

Referring to FIG. 13A, the bottom lead semiconductor package in accordance with a third modification of the present invention has the same structure as that of above-described one embodiment except that the lead 34 has a different shape thereto.

Referring to FIG. 13B, the lead 34 of the lead frame 30 in accordance with the third modification includes a first lead 34a having a predetermined length vertically extended from the dam bar 33, a lead distribution portion 34d formed vertical to the first lead 34a and parallel to the dam bar 33, a second lead 34b formed bent in the first direction from the dam bar 33 and the lead distribution portion 34d, and a third lead formed downwardly from the dam bar 33 and the lead distribution portion 34d.

Each of one end of the first, second and third leads 34a, 34b and 34c are connected to each other by the dam bar 33, while the other ends thereof are connected to each other by the lead distribution portion 34d.

A predetermined portion of the second lead is exposed on a first surface of the package main body 44, and a predetermined portion of the third lead is exposed on a second surface of the package main body 44, so that each predetermined portion of the second lead 34b and the third lead 34c serves as an external connection terminal for electrical connection to the outside.

FIGS. 14A through 14D are sectional view showing fabricating process of the bottom lead semiconductor package illustrated in FIGS. 10A through 10C in accordance with the present invention.

Figure 14A:
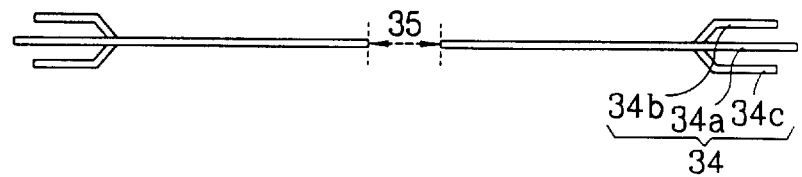
FIGS. 14A through 14d are sectional view showing fabricating process of the bottom lead semiconductor package illustrated in FIGS. 10A through 10C in accordance with the present invention.

Referring to FIG. 14A, a lead frame 30, like that of FIGS. 10A through 10C, includes a first lead 34a having a predetermined length, a second lead 34b of which a predetermined portion is exposed on the first surface of the package main body after molding, and a third lead 34c of which a predetermined portion is exposed on the second surface of the package main body after molding.

Figure 14B:
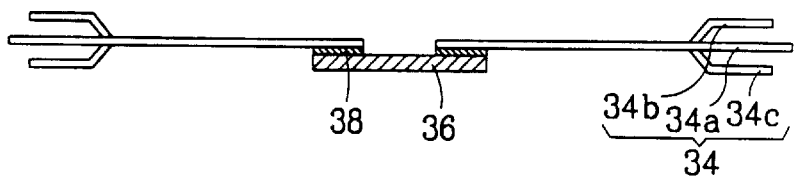

Referring to FIG. 14B, the semiconductor chip 36 having a plurality of bonding pads (not shown) is attached onto the second surface of the first lead 34a by using an insulating adhesive member 38.

Normally, the bonding pads are positioned at the center of the semiconductor chip 36, and exposed through an opening 35, that is, a space between the first leads 34a (referred to FIG. 9A).

Figure 14C:
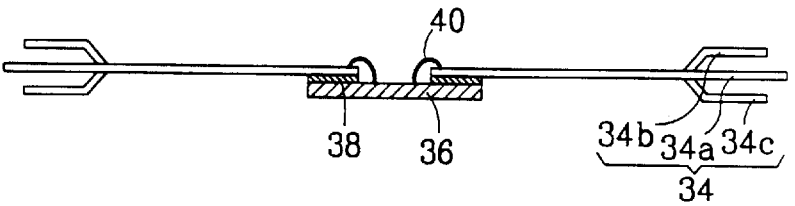

Referring to FIG. 14C, the bonding pads and the first leads 34a are respectively electrically connected by using a conductive wire 40.

Figure 14D:
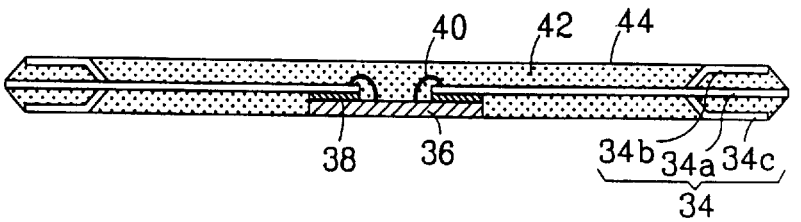

Referring to FIG. 14D, a predetermined region including the lead 34, the semiconductor chip 36 and the wire 40 is sealed by a molding resin 42 to form the package main body 44 with a predetermined portions of the second and third leads 34b and 34c exposed outward. Normally, the bonding pads of the semiconductor chip 36 are positioned at the center of the chip 36.

Each predetermined portion of the second and third leads 34b and 34c exposed on the package main body 44 serves to transmit an electrical signal of the semiconductor chip 36 to outside.

Referring to FIGS. 5A and 5B, after the molding process, the tie bar of the lead frame 30 is cut and the guide rails 32a and 32b and the dam bar 33 supporting the leads 34 are also cut, to electrically separate the leads 34.

Figure 15A:
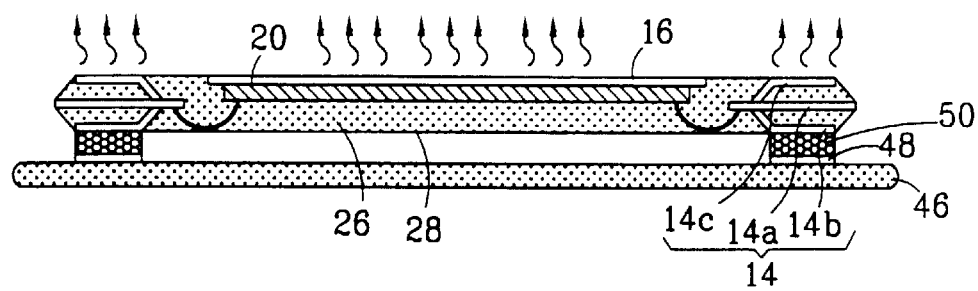
FIGS. 15A and 15B are sectional views showing one bottom lead semiconductor package illustrated in FIG. 4A mounted on a printed circuit board in accordance with the present invention.
Figure 15B:
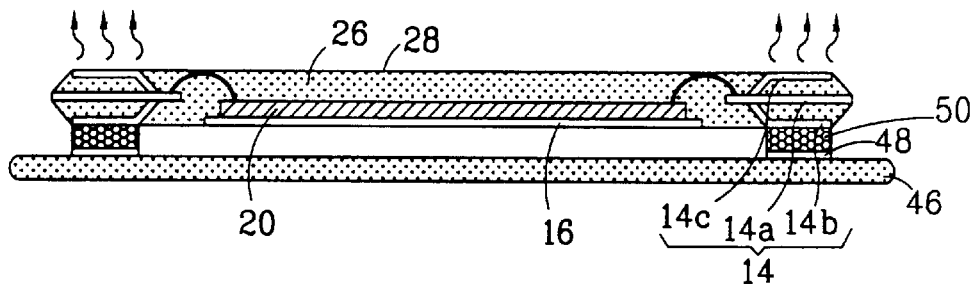

FIGS. 15A and 15B are sectional views showing one bottom lead semiconductor package illustrated in FIG. 4A mounted on a printed circuit board in accordance with the present invention.

Referring to FIG. 15A, the second leads 14b exposed on the first surface of the package main body 28 are electrically connected to the connection pads 48 on a printed circuit board 46 by using a solder 50, and a heat is released through the third lead 14c and the die paddle 16 exposed on the second surface of the package main body.

Referring to FIG. 15B, the third leads 14C exposed on the second surface of the package main body 28 are electrically connected to the connection pads 48 on the printed circuit board 46 by using the solder 50, and a heat is released through the second lead 14b exposed on the first surface of the package main body.

In addition, as to any bottom lead semiconductor package as described above, it can be mounted on the printed circuit board by using the corresponding method as in FIGS. 15A and 15B.

Figure 16:
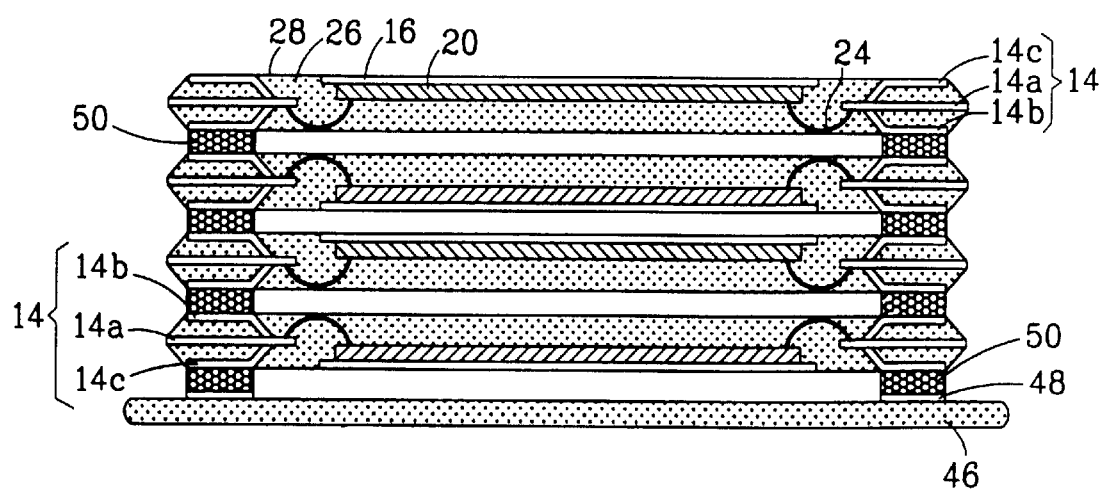
FIG. 16 is a sectional view showing formation that a bottom lead semiconductor package of FIG. 4A is stacked on the printed circuit board in accordance with the present invention.

FIG. 16 is a sectional view showing formation that a bottom lead semiconductor package of FIG. 4A is stacked on the printed circuit board in accordance with the present invention.

Referring to FIG. 16, the bottom lead semiconductor packages stacked on the printed circuit board 46 are readily connected electrically to each other through the leads exposed on their first and second surfaces, and the leads electrically connected by the solder 50 face each other by mirror configuration.

In addition, all of the bottom lead semiconductor packages as described above can be stacked on the printed circuit board by the corresponding method as in the FIG. 16.

As so far described, according to the lead frame and bottom lead semiconductor package using the lead frame, the leads, each serving as an external connection lead, are exposed on the first and the second surfaces of the package, facilitating stacking several packages. Also, when a package is mounted on the printed circuit board by one, heat releasing is much improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A bottom lead semiconductor package comprising:
   a semiconductor chip having a first and a second surfaces, and having a plurality of bonding pads on the first surface;
   a plurality of leads each comprising a first lead having a first and a second surfaces, the first surface of the first lead being attached onto the first surface of the semiconductor chip, a second and a third leads each having a first and a second surfaces extended from a predetermined portion of the first lead, wherein the second lead includes a first portion bent in a first direction from the predetermined portion of the first lead, and a second portion bent in a second direction away from the semiconductor chip, and wherein the third lead includes a first portion bent in a third direction from the predetermined portion of the first lead, and a second portion bent in a fourth direction away from the semiconductor chip, the first and third directions being different from each other;
   connection means for electrically connecting the first leads and the bonding pads; and
   a package main body of which a predetermined region including the semiconductor chip, the plurality of leads and the connection means are sealed with the first surface of the second portion of the second leads and the second surface of the second portion of the third leads exposed respectively.

2. The bottom lead semiconductor package according to claim 1, wherein the second lead and the third lead are located near the first and second surfaces of the semiconductor chip respectively.

3. The bottom lead semiconductor package according to claim 1, wherein the plurality of bonding pads are formed at the center of the first surface of the semiconductor chip.

4. The bottom lead semiconductor package according to claim 1, wherein the predetermined portion of the first lead is one of a central portion, an edge portion or one end portion.

5. A lead frame comprising:
   a pair of guide rails separated parallel with each other at a predetermined space;
   at least one dam bar for connecting the pair of guide rails;
   a die paddle for mounting a semiconductor chip between the pair of guide rails;
   a tie bar for supporting the die paddle; and
   a plurality of leads each comprising
      a first lead bent in a first direction from the dam bar,
      a wire contact portion formed at one side of the first lead and
      a second lead bent in a second direction from the wire contact portion, wherein
         the first and second directions are different from each other, wherein the first lead includes a first portion bent in the first direction, a second portion bent in a third direction, and a third portion bent in a fourth direction, and wherein the second lead includes a first portion bent in the second direction, and a second portion bent in a fifth direction.

* * * * *